(12) United States Patent
Fulford

(10) Patent No.: US 6,271,114 B1
(45) Date of Patent: Aug. 7, 2001

(54) SYSTEM FOR ADJUSTING THE SIZE OF CONDUCTIVE LINES BASED UPON THE CONTACT SIZE

(75) Inventor: H. Jim Fulford, Austin, TX (US)

(73) Assignee: Advanced Micro Devices, Inc., Austin, TX (US)

(*) Notice: Subject to any disclaimer, the term of this patent is extended or adjusted under 35 U.S.C. 154(b) by 0 days.

(21) Appl. No.: 09/587,809

(22) Filed: Jun. 6, 2000

Related U.S. Application Data

(62) Division of application No. 09/410,710, filed on Oct. 1, 1999, now Pat. No. 6,124,197.

(51) Int. Cl.$^7$ ............................................. H01L 21/4763
(52) U.S. Cl. ..................... 438/618; 438/618; 438/620; 438/622; 438/630; 438/128; 438/129; 438/594; 438/597; 438/598; 257/202; 257/208
(58) Field of Search ..................... 438/618–630, 438/128–129, 598, 597, 594; 257/202–208

(56) References Cited

U.S. PATENT DOCUMENTS

| | | | |
|---|---|---|---|
| 4,151,607 | 4/1979 | Koyanagi et al. | 365/174 |
| 4,544,445 | 10/1985 | Jeuch et al. | 156/643 |
| 4,789,648 | 12/1988 | Chow et al. | 437/225 |
| 5,405,798 | 4/1995 | Ema | 437/52 |
| 5,422,309 | 6/1995 | Zettler et al. | 437/192 |
| 5,565,385 | 10/1996 | Rostoker et al. | 437/209 |
| 5,893,748 | 4/1999 | Lin | 438/618 |
| 5,960,313 | 9/1999 | Jun | 438/624 |
| 6,033,980 | 3/2000 | Liou et al. | 438/624 |

OTHER PUBLICATIONS

R.R. Uttecht, IEEE VMIC Conference Jun. 11–12 1991 #TH–0359–0/91/0000–0020 p. 20.

J.L. Yeh, IEEE VMIC Conference Jun. 13–14 1998 CH–2624–5/88/0000–0095 p. 95.

Primary Examiner—Matthew Smith
Assistant Examiner—Granville D. Lee, Jr.
(74) Attorney, Agent, or Firm—Williams, Morgan & Amerson, P.C.

(57) ABSTRACT

The present invention is directed to a method of forming conductive interconnections in an integrated circuit device to optimize or at least maintain the speed at which signals propagate throughout the integrated circuit device. In one embodiment, the method comprises determining any variation in the size of a contact, as compared to its design size, and varying the size of a conductive line to be coupled to the contact based upon the variation in the size of the contact.

50 Claims, 6 Drawing Sheets

SYSTEM FOR ADJUSTING THE SIZE OF CONDUCTIVE LINES BASED UPON THE CONTACT SIZE

This is a divisional of application Ser. No. 09/410,710, filed Oct. 1, 1999 now U.S. Pat. No. 6,124,197.

BACKGROUND OF THE INVENTION

1. Field of the Invention

The present invention is directed to the field of semiconductor processing, and, more particularly, to a method of forming metal interconnections on an integrated circuit device.

2. Description of the Related Art

There is a constant drive to reduce the channel length of transistors to increase the overall speed of the transistor, as well as integrated circuit devices incorporating such transistors. A conventional integrated circuit device, such as a microprocessor, is typically comprised of many thousands of semiconductor devices, e.g., transistors, formed above the surface of a semiconducting substrate. For the integrated circuit device to function, the transistors must be electrically connected to one another through conductive interconnections. Many modern integrated circuit devices are very densely packed, i.e., there is very little space between the transistors formed above the substrate. Thus, these conductive interconnections must be made in multiple layers to conserve plot space on the semiconducting substrate. This is typically accomplished through the formation of a plurality of conductive lines and conductive plugs formed in alternative layers of dielectric materials formed on the device. As is readily apparent to those skilled in the art, the conductive plugs are means by which various layers of conductive lines, and/or semiconductor devices, may be electrically coupled to one another. The conductive lines and plugs may be made of a variety of conductive materials, such as copper, aluminum, aluminum alloys, titanium, tantalum, titanium nitride, tantalum nitride, tungsten, etc.

There is a constant drive within the semiconductor industry to increase the operating speed of integrated circuit devices, e.g., microprocessors, memory devices, etc. This drive is fueled by consumer demands for computers and electronic devices that operate at increasingly greater speeds. One factor that affects the speed at which integrated circuit products operate is the speed at which electrical signals propagate through the device. Electrical signals travel within the device along the interconnected conductive iines and contacts. The greater the resistance of these lines and contacts, the slower the signals will propagate through the integrated circuit device, and the slower it will operate.

A great level of effort goes into sizing and routing this vast collection of interconnections in an effort to minimize the resistance of the contacts and lines in the device such that device performance, i.e., speed, is optimized or at least suitable for the design parameters of the particular product under consideration. However, as with most products that have to be fabricated, variations in the physical dimensions or size of the contact, as compared to those contemplated by the particular design, may occur due to a variety of factors inherent in manufacturing operations. For example, contacts, as actually manufactured, may vary from their design size due to under- or over-etching, or the dielectric layer in which they will be formed may be manufactured thinner or thicker than that anticipated by the design process. Whatever the source, variations in the physical size of a contact can have a negative impact on device performance.

For example, as contact size decreases, the resistance of the circuit coupled to that contact increases, since the resistance of the contact is inversely proportional to the size of the contact. Left unchecked, errors such as those described above can reduce the overall performance and operating speed of the integrated circuit product.

The present invention is directed to a method of manufacturing semiconductor device that minimizes or reduces some or all of the aforementioned problems.

SUMMARY OF THE INVENTION

The present invention is directed to a method of forming conductive interconnections on a semiconductor device. In one illustrative embodiment, the method comprises determining a variation in the size of a conductive contact as compared to the design size for the contact, and determining if a size of a conductive line to be coupled to the contact needs to be varied based upon the determined size variation of the contact. The invention may also include the act of varying the size of the conductive line based upon the determined size variation of the contact.

BRIEF DESCRIPTION OF THE DRAWINGS

The invention may be understood by reference to the following description taken in conjunction with the accompanying drawings, in which like reference numerals identify like elements, and in which.

Figure 1:
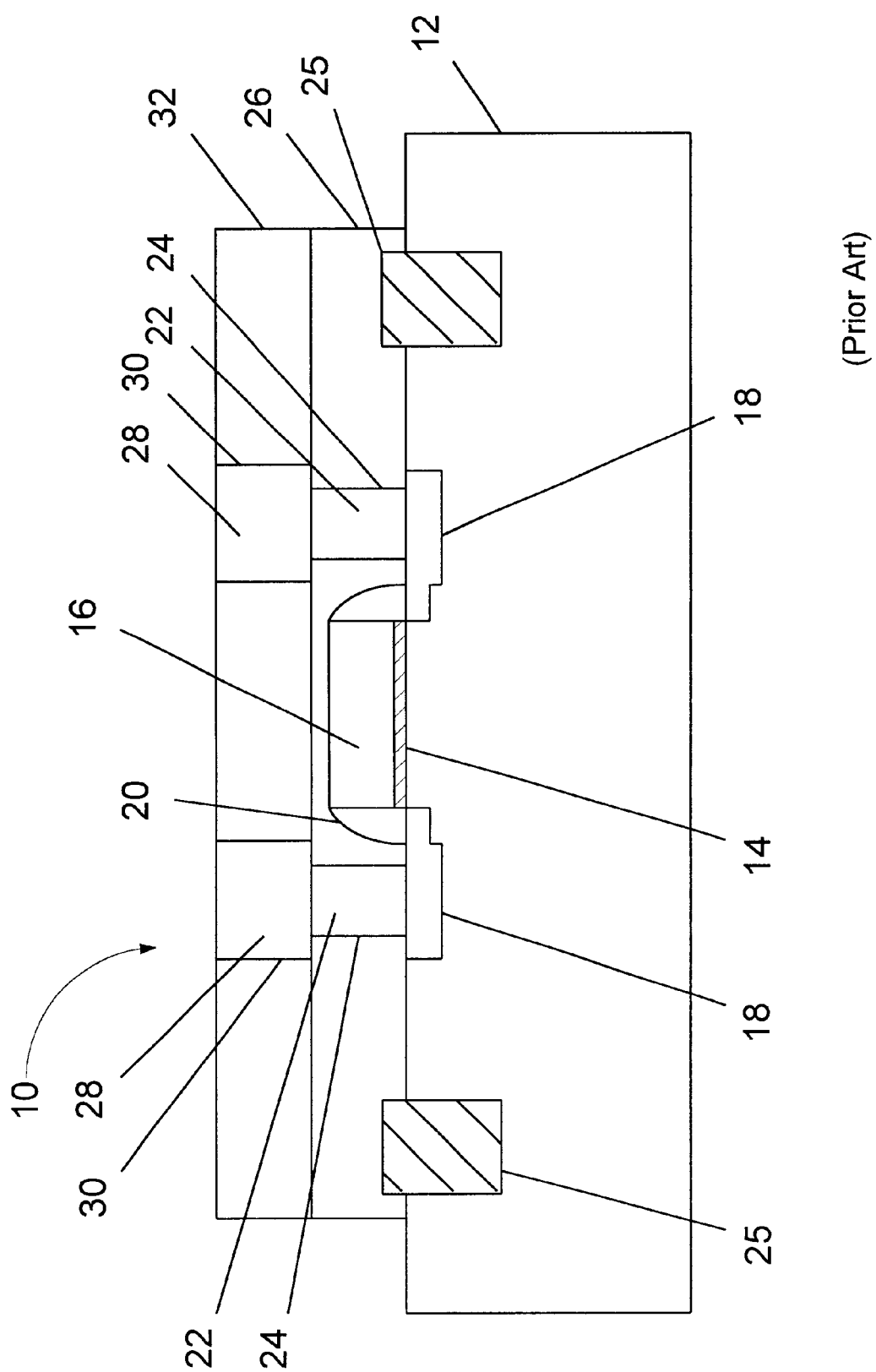
FIG. 1 is a cross-sectional view of an illustrative prior art transistor.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and businessrelated constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to FIGS. 2–6. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features depicted in the drawings may be exaggerated or reduced as compared to the size of those feature sizes on fabricated devices. Nevertheless, the attached drawings are included to describe and explain illustrative examples of the present invention.

In general, the present invention is directed to adjusting the size of conductive lines based upon the size of contacts to which the line is to be coupled. As will be readily apparent to those skilled in the art upon a complete reading of the present application, the present method is applicable to a variety of technologies, e.g., NMOS, PMOS, CMOS, etc., and is readily applicable to a variety of devices, including, but not limited to, logic devices, memory devices, etc.

As stated previously, an integrated circuit device is comprised of many thousands of transistors. An illustrative transistor 10 that may be included in such an integrated circuit device is shown in FIG. 1. The transistor 10 is generally comprised of a gate dielectric 14, a gate conductor 16, a plurality of source/drain regions 18 formed in a semiconducting substrate 12. The gate dielectric 14 may be formed from a variety of dielectric materials, such as silicon dioxide. The gate conductor 16 may also be formed from a variety of materials, such as polysilicon. The source and drain regions 18 may be formed by one or more ion implantation processes in which a dopant material is implanted into the substrate 12.

Next, a first dielectric layer 26 is formed above the transistor 10, and a plurality of vias or openings 24 are formed in the first dielectric layer 26. Thereafter, the vias 24 are filled with a conductive material, such as a metal, to form contacts 22. The contacts 22 are electrically coupled to the source and drain regions 18 of the transistor 10. Thereafter, a second dielectric layer 32 may be formed above the first dielectric layer 26. Multiple openings 30 may be formed in the second dielectric layer 32 and the openings 30 may thereafter be filled with a conductive material to form conductive lines 28. Although only one level of contacts and one level of conductive lines are depicted in FIG. 1, there may be multiple levels of contacts and lines interleaved with one another. This interconnected network of contacts and lines allows electrical signals to propagate throughout the integrated circuit device. The techniques used for forming the various components depicted in FIG. 1 are known to those skilled in the art and will not be repeated here in any detail.

Figure 2B:
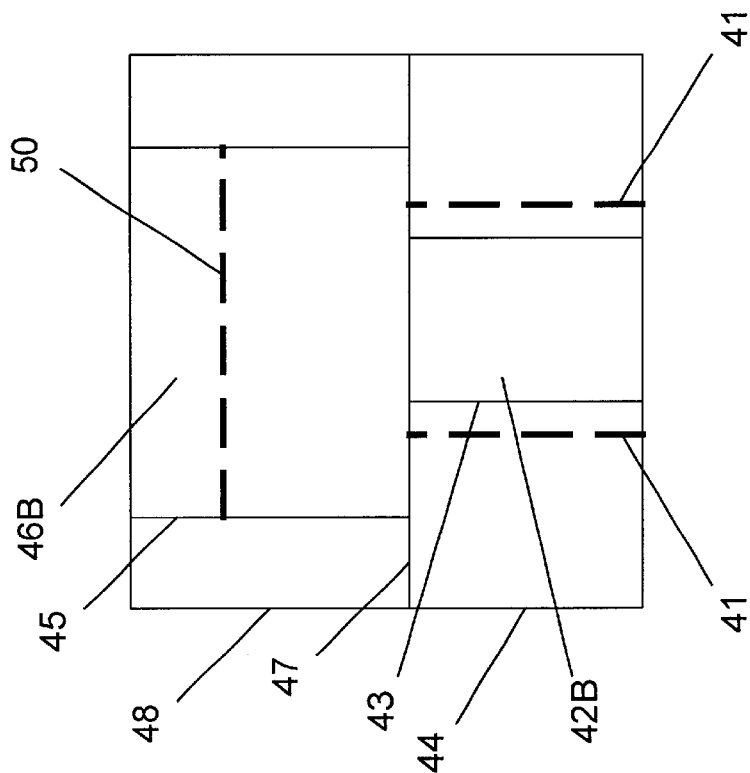
FIG. 2B is a cross-sectional view of an illustrative conductive line and contact in which compensatory changes have been made to the size of the conductive line due to variations in the size of the contact.
Figure 2A:
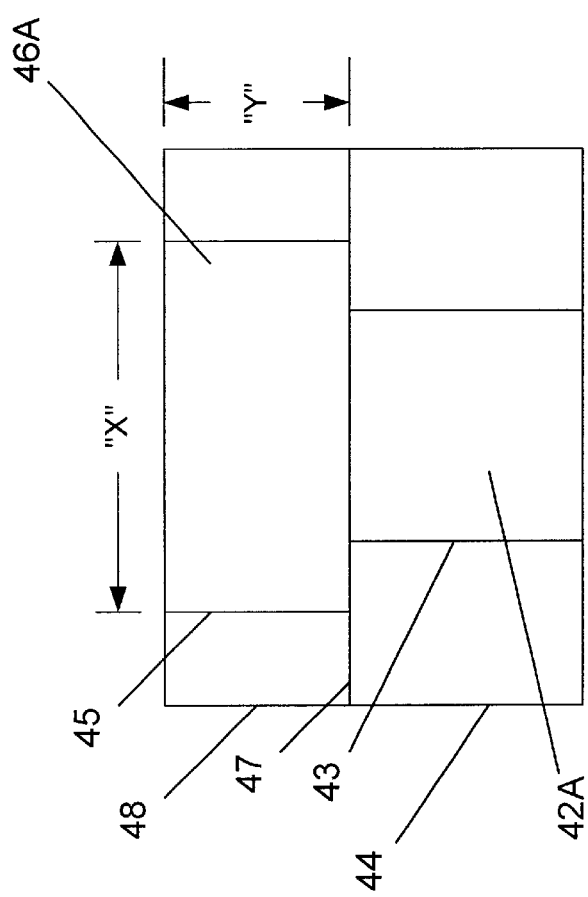
FIG. 2A is a cross-sectional view of an illustrative conductive line and contact of the size contemplated by the design process.

The present invention will now be further described with references to FIGS. 2A and 2B. As shown in FIG. 2A, a contact 42A is formed in a dielectric layer 44. The contact 42A may be of any size or configuration, it may be formed by any of a variety of techniques, and it may be comprised of any of a variety of conductive materials. Traditionally, the contact 42A has a circular cross-section, i.e., the contact is essentially a cylinder of material. However, the contact 42A can be made into any of a variety of shapes, e.g., square, rectangular, etc. Further, the dielectric layer 44 may be comprised of any dielectric material, such as silicon dioxide or a low-k dielectric. Typically, the dielectric layer 44 is formed by depositing the layer, and thereafter, subject it to a planarization operation, such as a chemical mechanical polishing ("CMP") operation, so as to produce an essentially planar surface 47. Next, a plurality of vias 43 are formed in the dielectric layer 44 by traditional photolithography and one or more traditional etching processes, e.g., an anisotropic plasma etching process.

Thereafter, a layer (not shown) of the appropriate conductive material, e.g., a metal, may be blanket-deposited over the transistor, thereby filling the vias 43 formed in the first dielectric layer 44. The metal layer (not shown) may thereafter be subjected to a CMP process to remove the excess material, thereby leaving the contact 42A in the via 43. As stated previously, the contact 42A may be comprised of any of a variety of materials, such as tungsten, aluminum, copper, titanium, etc.

Next, a dielectric layer 48 is formed above the dielectric layer 44, and a plurality of openings 45 may be defined in the dielectric layer 48 through use of traditional photolithography and etching processes. Thereafter, a conductive line 46A is formed in the opening 45 in the dielectric layer 48. As with the contact 42A, the conductive line 46A may be formed in any of a variety of shapes, using any of a variety of known techniques for forming such lines, and may be comprised of a variety of materials. For example, the conductive line 46A may be comprised of aluminum that is the result of patterning a layer of aluminum and thereafter forming the dielectric layer 48 between the various lines 46A. That is, the present invention may be employed in situations in which the conductive lines are formed using a dual or single damascene process or in processes where a conductive material is patterned and a dielectric material is thereafter positioned between the patterned layer of conductive material.

The contact 42A and line 46A depicted in FIG. 2A represent the physical dimensions of the contact 42A and line 46A contemplated by the design process. In the illustrative example where the contact 42A is circular in cross-section, the diameter of the contact 42A is shown in FIG. 2A. With respect to the conductive line 46A, in the illustrative situation where the line 46A has a substantially rectangular cross-section, it has a width dimension, as indicated by the arrow "X," and a height or thickness dimension, as indicated by the arrow "Y." Of course, as stated previously, the configuration of the contact 42A and the conductive line 46A may be of any desired shape. Of course, the actual design size of any contact or conductive line may depend on the particular application under consideration or may simply be a matter of design choice.

FIG. 2B depicts a situation in which, due to a variety of factors, the size of a contact 42B is different from the design size of the contact, and depicts one technique for compensating for such variations in the size of the contact. As shown in FIG. 2B, a contact 42B has a smaller diameter than the design diameter of the contact, as indicated by dashed lines 41 shown in FIG. 2B. Compare the size of the contact 42A with the size of the contact 42B. In short, the contact 42B depicted in FIG. 2B is smaller than its design size. As stated previously, the undersized contact 42B results in an increased resistance for the overall circuit, thereby delaying signal propagation through the circuit and, thus, device performance. FIG. 2B depicts one illustrative technique for compensating for the variation in size of the contact 42B as compared to the design size of the contact. For example, the thickness or height of the conductive line 46B in FIG. 2B, i.e., the dimension in the direction indicated by "Y," is increased to compensate for the undersized contact 42B. That is, the thickness of the conductive line 46B is increased beyond its design thickness, as indicated by dashed line 50, to compensate for the reduced size of the contact 42B.

Although the particular example discussed in FIGS. 2A–2B have been discussed in terms of the diameter of a circular contact being smaller than the designed diameter of the contact, the present invention is not limited to merely detecting variations in the diameter of a particular contact. For example, the height of a contact may be greater or less than anticipated by design. Should the dielectric layer 44 in which the contact 42B will be formed be thinner than anticipated by design, the resulting contact formed in that layer will also be less than anticipated by design.

The change in size of the contact may be determined by a variety of techniques and at a variety of points in the design process. For example, the thickness of the dielectric layer 44 may be determined using a metrology tool capable of performing such a measurement, e.g., an ellipsometer. Alternatively, after a via 43 is formed in the dielectric layer 44, the diameter of a via 43 may be determined by any metrology tool capable of performing this type of critical dimension measurement, e.g., an in-line scanning electron microscope (SEM), a KLA tool, etc.

Figure 3:
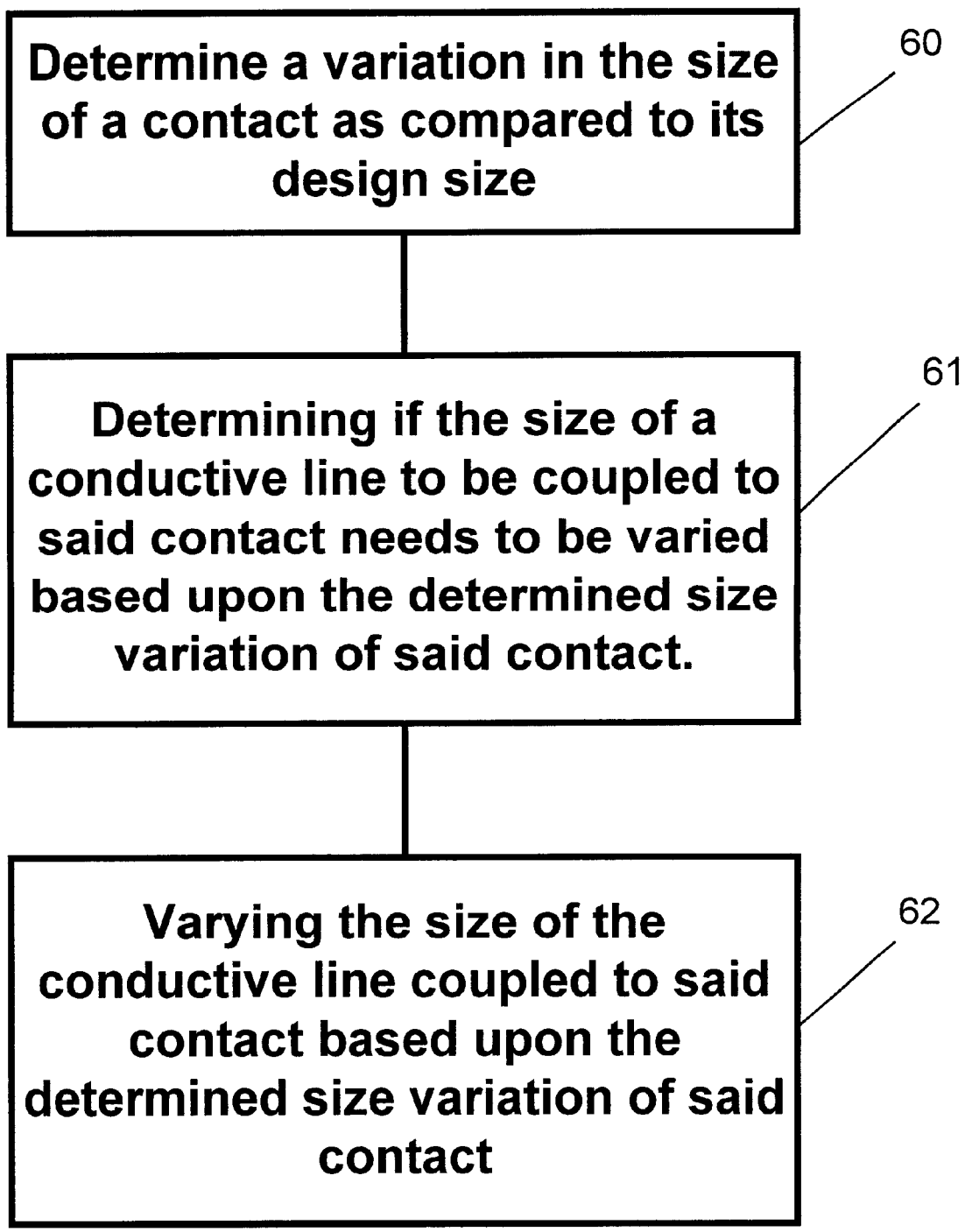
FIG. 3 is a flowchart depicting an illustrative embodiment of the present invention.

FIG. 3 depicts one illustrative embodiment of the present invention. As shown therein, the method comprises determining a variation in the size of a contact as compared to its design size, as indicated at block 60, and determining if the size of a conductive line to be coupled to the contact needs to be varied based upon the determined size variation of the contact, as indicated at block 61. As described above, the step of determining a variation in the size of a contact may be accomplished by a variety of techniques using a variety of metrology tools, e.g., an in-line SEM or an ellipsometer. The step performed at block 60 may be performed only on a representative number of samples, and the resulting information extrapolated to reflect conditions on a die or wafer basis. In general, the step of determining a variation in a size of a contact may be performed by determining a variation in any physical dimension of the contact, e.g., height, diameter, length, or width. Moreover, the step of determining a size of the conductive line to be coupled to the contact, as indicated in block 61, may be performed by determining if any physical dimension of the conductive line, or its size, needs to be varied based upon the change in a physical dimension of the contact.

The method further comprises varying the size of the conductive line to be coupled to the contact based upon the determined size variation of the contact, as indicated at block 62. The step described at block 62 may be performed by varying a physical dimension of a conductive line, or determining a size of the conductive line, based upon a variation of a physical dimension of the contact, as may be determined in block 60.

The step of determining if the size of a conductive line needs to be varied based upon the determined size variation of the contact ma) be performed by a variety of techniques. For example, a computer database which corresponds a given contact size (absolute or differential from the design size) to a desired size of the conductive line that will be coupled to the contact could be created. Alternatively, any variation to the size of the conductive line may be based upon a calculation of the resistance for the contact and the yet to be formed conductive line. Moreover, this calculation could be on an individual basis or on system-wide basis for the entire integrated circuit.

Figure 4:
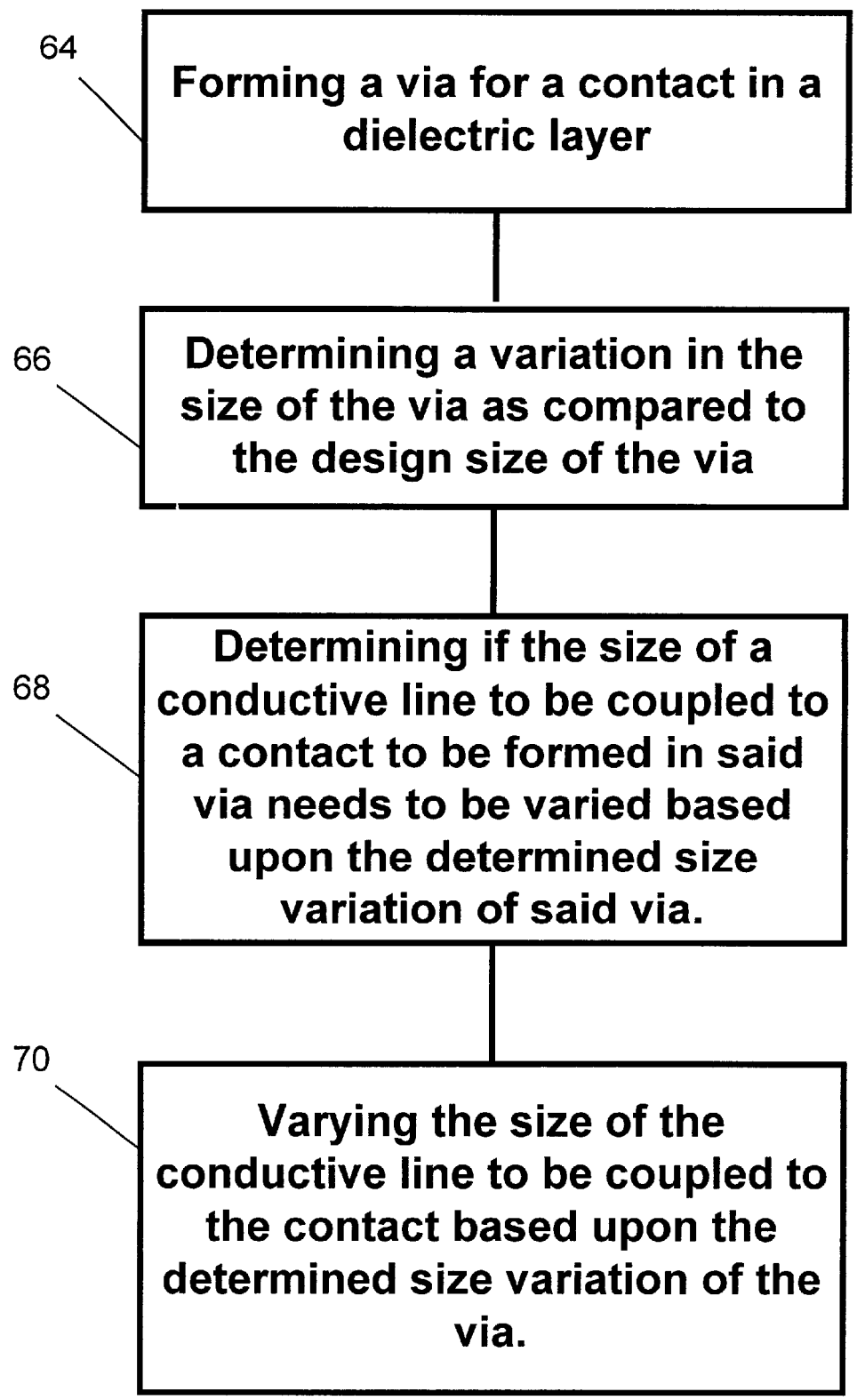
FIG. 4 is a another flowchart depicting another illustrative embodiment of the present invention.

Another illustrative embodiment of the present invention is depicted in FIG. 4. As shown therein, the method comprises forming a via for a contact in a dielectric layer, as indicated in block 64, and determining a variation in the size of the via as compared to the design size of the via, as indicated at block 66. The method further comprises determining if the size of a conductive line to be coupled to a contact to be formed in said via needs to be varied based upon the determined size variation of the via, as indicated at block 68, and varying the size of the conductive line to be coupled to the contact based upon the determined size variation of the via, as indicated at block 70.

Figure 5:
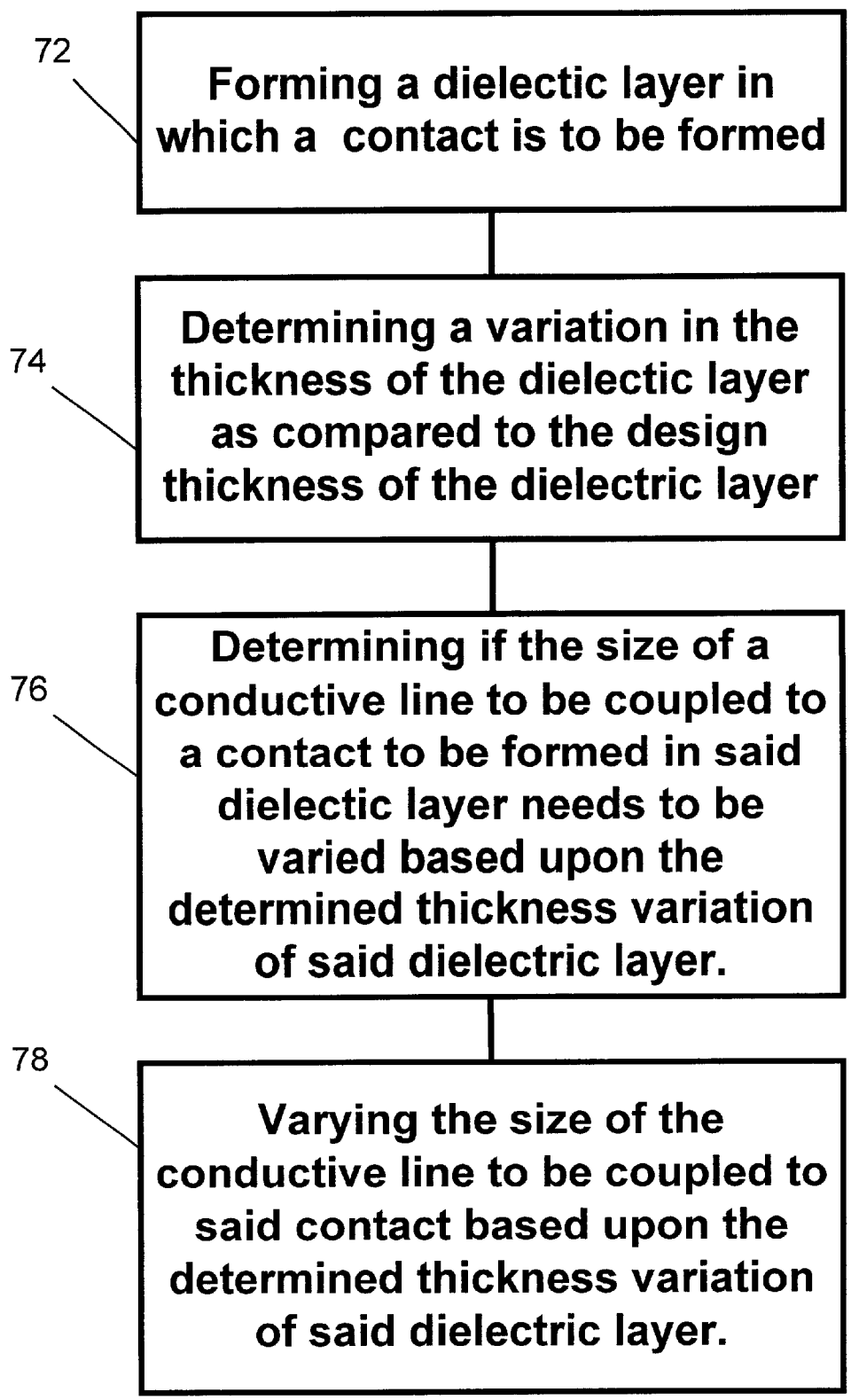
FIG. 5 is yet another flowchart depicting yet another illustrative embodiment of the present invention.

Yet another illustrative embodiment of the present invention is further depicted in FIG. 5. The method comprises forming a dielectric layer in which a contact is to be formed, as indicated at block 72, and determining any variation in the thickness of the dielectric layer as compared to the design thickness of the dielectric layer, as indicated at block 74. The method further comprises determining if the size of a conductive line to be coupled to a contact to be formed in the dielectric layer needs to be varied based upon the determined thickness variation of the dielectric layer, as indicated at block 76, and varying the size of the conductive line to be coupled to the contact based upon the thickness variation of said dielectric layer, as indicated at block 78.

The present invention may also be embodied in a machine or computer readable format, e.g, an appropriately programmed computer, a software program written in any of a variety of programming languages. The software program would be written to carry out various functional operations of the present invention, such as those indicated in FIGS. 3–5, and elsewhere in the specification. Moreover, a machine or computer readable format of the present invention may be embodied in a variety of program storage devices, such as a diskette, a hard disk, a CD, a DVD, a nonvolatile electronic memory, or the like. The software program may be run on a variety of devices, e.g., a processor.

Figure 6:
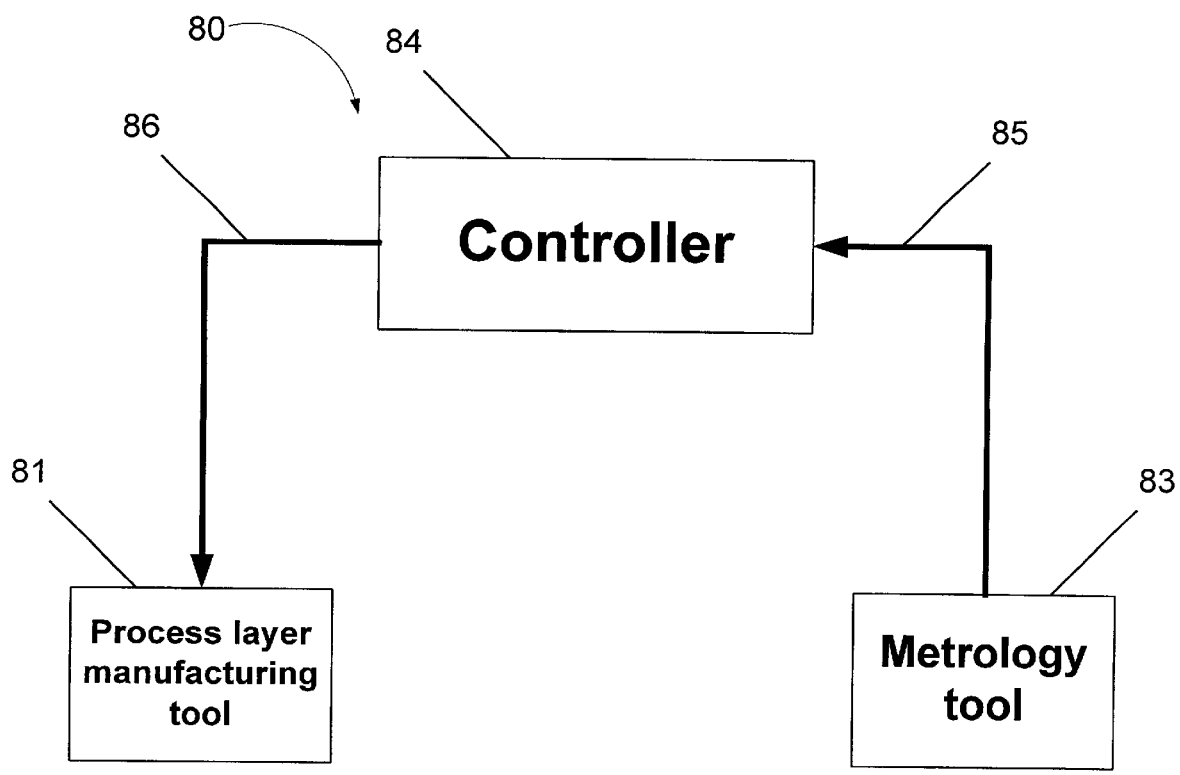
FIG. 6 is an illustrative embodiment of a system that may be used with the present invention.

The present invention is also directed to a processing system, e.g., a processing tool or combination of processing tools, for accomplishing the present invention. As shown in FIG. 6, an illustrative system 80 is comprised of a process layer manufacturing tool 81, a metrology tool 83, and a controller 84. In one illustrative process flow, a first dielectric layer, e.g., dielectric layer 44 in FIG. 2B, is formed, then a surface of the dielectric layer 44 is planarized with, for example, a CMP planarization tool. Thereafter, measurement of the thickness of the first dielectric layer 44 after polishing operations may be taken by a metrology tool 83, such as an ellipsometer.

The results obtained by the metrology tool 83 are sent to the controller 84 via input line 85. In turn, the controller 84 may send commands to the process layer manufacturing tool 81 to adjust or vary the manufactured thickness of a process layer used in manufacturing a conductive line to be coupled to a contact to be formed in the first dielectric layer 44. For example, in the situation where the conductive line will be comprised of aluminum, the controller 84 may send commands to a process layer manufacturing tool 81 adapted to blanket-deposit a layer of metal on the device to form a layer of aluminum a given thickness to compensate for changes in the thickness of the dielectric layer 44 (representing the height of the contact) as compared to the design thickness of the dielectric layer. The command from the controller 84 may be based upon calculations made in the controller, or based upon a database containing information correlating desired sizes of conductive lines to actual sizes of the contact to which they will be coupled.

Alternatively, the particular process used may be such that a second dielectric layer, e.g., layer 46 in FIG. 2B, may be formed and patterned and, thereafter, a conductive material, such as copper, may be formed in the openings defined in the second dielectric layer 46. In this situation, then the process layer manufacturing tool 81 would be a tool adapted to form such a dielectric layer.

The controller 84 may be any type of device that includes logic circuitry for executing instructions. Moreover, the controller 84 depicted in FIG. 6 may be a stand-alone controller or it may be one or more of the controllers already resident on either or both of the process layer manufacturing tool 81 or the metrology tool 83.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A system, comprising:
    a metrology tool for determining a size of a contact; and
    a process layer manufacturing tool adapted to vary, based upon the determined size of said contact, a thickness of a process layer used in the manufacturing of a conductive line to be coupled to said contact.

2. The system of claim 1, further comprising a controller that allows communications between said metrology tool and said process layer manufacturing tool.

3. The system of claim 1, wherein said process layer manufacturing tool is adapted to form a layer of metal.

4. The system of claim 1, wherein said process layer manufacturing tool is adapted to form a layer of dielectric material.

5. The system of claim 1, wherein said metrology tool is an ellipsometer.

6. The system of claim 1, wherein said metrology tool is a scanning electron microscope.

7. The system of claim 1, wherein said process layer manufacturing tool is a deposition tool.

8. The system of claim 1, wherein said controller is a stand-alone controller.

9. The system of claim 1, wherein said controller is resident on said metrology tool.

10. The system of claim 1, wherein said controller is resident on said process layer manufacturing tool.

11. A system, comprising:
    a metrology tool for determining a size of a via formed in a layer of dielectric material in which a contact will be formed; and
    a process layer manufacturing tool adapted to vary, based upon the determined size of said via, a thickness of a process layer used in the manufacturing of a conductive line to be coupled to said contact.

12. The system of claim 11, further comprising a controller that allows communications between said metrology tool and said process layer manufacturing tool.

13. The system of claim 11, wherein said process layer manufacturing tool is adapted to form a layer of metal.

14. The system of claim 11, wherein said process layer manufacturing tool is adapted to form a layer of dielectric material.

15. The system of claim 11, wherein said metrology tool is an ellipsometer.

16. The system of claim 11, wherein said metrology tool is a scanning electron microscope.

17. The system of claim 11, wherein said process layer manufacturing tool is a deposition tool.

18. The system of claim 11, wherein said controller is a stand-alone controller.

19. The system of claim 11, wherein said controller is resident on said metrology tool.

20. The system of claim 11, wherein said controller is resident on said process layer manufacturing tool.

21. A system, comprising:
    a metrology tool for determining a variation in a size of a contact as compared to a design size of said contact; and
    a process layer manufacturing tool adapted to vary, based upon said determined size variation, a thickness of a process layer used in the manufacturing of a conductive line to be coupled to said contact.

22. The system of claim 21, further comprising a controller that allows communications between said metrology tool and said process layer manufacturing tool.

23. The system of claim 21, wherein said process layer manufacturing tool is adapted to form a layer of metal.

24. The system of claim 21, wherein said process layer manufacturing tool is adapted to form a layer of dielectric material.

25. The system of claim 21, wherein said metrology tool is an ellipsometer.

26. The system of claim 21, wherein said metrology tool is a scanning electron microscope.

27. The system of claim 21, wherein said process layer manufacturing tool is a deposition tool.

28. The system of claim 21, wherein said controller is a stand-alone controller.

29. The system of claim 21, wherein said controller is resident on said metrology tool.

30. The system of claim 21, wherein said controller is resident on said process layer manufacturing tool.

31. A system, comprising:
    a metrology tool for determining a variation in a size of a via in which a contact will be formed as compared to a design size for said via; and
    a process layer manufacturing tool adapted to vary, based upon said determined size variation of said via, a thickness of a process layer used in the manufacturing of a conductive line to be coupled to said contact.

32. The system of claim 31, further comprising a controller that allows communications between said metrology tool and said process layer manufacturing tool.

33. The system of claim 31, wherein said process layer manufacturing tool is adapted to form a layer of metal.

34. The system of claim 31, wherein said process layer manufacturing tool is adapted to form a layer of dielectric material.

35. The system of claim 31, wherein said metrology tool is an ellipsometer.

36. The system of claim 31, wherein said metrology tool is a scanning electron microscope.

37. The system of claim 31, wherein said process layer manufacturing tool is a deposition tool.

38. The system of claim 31, wherein said controller is a stand-alone controller.

39. The system of claim 31, wherein said controller is resident on said metrology tool.

40. The system of claim 31, wherein said controller is resident on said process layer manufacturing tool.

41. A system, comprising:
- a metrology tool for determining a variation in a physical dimension of at least one of a via and a contact to be formed in said via; and
- a process layer manufacturing tool adapted to vary, based upon said determined physical dimension of said at least one of a via and a contact, a thickness of a process layer used in the manufacturing of a conductive line to be coupled to said contact.

42. The system of claim 41, further comprising a controller that allows communications between said metrology tool and said process layer manufacturing tool.

43. The system of claim 41, wherein said process layer manufacturing tool is adapted to form a layer of metal.

44. The system of claim 41, wherein said process layer manufacturing tool is adapted to form a layer of dielectric material.

45. The system of claim 41, wherein said metrology tool is an ellipsometer.

46. The system of claim 41, wherein said metrology tool is a scanning electron microscope.

47. The system of claim 41, wherein said process layer manufacturing tool is a deposition tool.

48. The system of claim 41, wherein said controller is a stand-alone controller.

49. The system of claim 41, wherein said controller is resident on said metrology tool.

50. The system of claim 41, wherein said controller is resident on said process layer manufacturing tool.

* * * * *